United States Patent [19]

Wysocki

[11] 4,186,346
[45] Jan. 29, 1980

[54] AMPLITUDE MODULATED TRANSMITTER
[75] Inventor: Bodo Wysocki, Berlin, Fed. Rep. of Germany
[73] Assignee: Licentia Patent-Verwaltungs-G.m.b.H., Fed. Rep. of Germany
[21] Appl. No.: 902,483
[22] Filed: May 3, 1978
[30] Foreign Application Priority Data
May 10, 1977 [DE] Fed. Rep. of Germany ....... 2720930
[51] Int. Cl.² .............................................. H04B 1/04
[52] U.S. Cl. .................................... 325/144; 325/182
[58] Field of Search ............... 325/144, 152, 182, 186, 325/187, 142; 332/19, 38, 9 R

[56] References Cited
U.S. PATENT DOCUMENTS

| | | | |
|---|---|---|---|
| 3,413,570 | 11/1968 | Bruene et al. | 325/182 |
| 3,477,042 | 11/1969 | Wachs | 325/187 |
| 3,943,446 | 3/1976 | Quidort | 325/144 |
| 4,122,415 | 10/1978 | Luther, Jr. et al. | 325/144 |

Primary Examiner—Robert L. Griffin
Assistant Examiner—Jin F. Ng
Attorney, Agent, or Firm—McGlew and Tuttle

[57] ABSTRACT

The transmitter has a carrier control and includes an exciter for supplying the carrier voltage to a modulation stage, usually the final RF-power amplifier of a broadcast transmitter, with the modulation voltage having a controlled dc content. The modulation voltage is amplified in a modulation amplifier and the amplified modulation voltage is supplied to the modulation stage. The modulation amplifier includes a switching amplifier producing pulse duration modulated pulses, a modulation voltage controlled pulse duration modulator preceding the switching amplifier and a filter section following the switching amplifier. An adder element is connected in advance of the modulation amplifier, specifically in advance of the modulation voltage-controlled pulse duration modulator. The applied modulation voltage is supplied to a rectifier followed by a filter section and the filter section is connected to a control element and supplies thereto a variable direct voltage as a volume-dependent control magnitude which contains also very low frequency components in accordance with the volume of the modulation voltage. The output of the control element is supplied to the adder element for combining with the modulation voltages supplied to the modulation amplifier to change the pulse duty factor of the output pulses of the switching amplifier as required for carrier control of the transmitter. The volume control magnitude supplied from the control element can be additionally superposed by a fixed direct voltage to establish the average pulse length of the output pulses of the pulse duration modulator and thus to establish the average direct voltage value of the filter section of the modulation amplifier and the average operating point of the modulation stage.

8 Claims, 2 Drawing Figures

AMPLITUDE MODULATED TRANSMITTER

FIELD OF THE INVENTION

This invention relates to an amplitude modulated transmitter with a carrier control by which the mean of respective amplitudes of the carrier voltage appearing within each transmitter modulation voltage period, is reduced with decreasing amplitudes, and including a modulation voltage rectifier and filter producing a control magnitude, which is a function of the volume for the transmitter modulation stage. More particularly, the present invention is directed to further reducing the energy consumption of known transmitters of this type and reducing the cost of known transmitters with a carrier control.

BACKGROUND OF THE INVENTION

Transmitters with carrier control are known, for example, from Meinke, Gundlach: *Handbook of High Frequency Engineering*, 1962, p. 1306, and also from U.S. Pat. No. 3,413,570. The advantage of amplitude modulated transmitters with carrier control is that, at low points of program modulation, that is, at a low modulation voltage, power can be saved so that the apparent "efficiency" of the transmitter is increased.

There are also known other techniques for increasing the efficiency of an amplitude modulated transmitter. For example, for modulation amplifier purposes, there can be used a switching amplifier for pulse duration modulated pulses, and which is followed by a filter section for filtering the switching frequency and which is preceded by a pulse duration modulator. With this arrangement, the pulse duration modulator converts modulation oscillation to pulse duration-modulated pulses which, upon amplification in the switching amplifier are re-converted by filter sections means, to an oscillation corresponding to the modulation oscillation. With such an arrangement, the improvement in transmitter efficiency is based on the high efficiency of the switching amplifier, such as shown in German Patent No. 1 218 557 and German Auslegeschrift No. 1 808 578. A further improvement in efficiency can be obtained by also having the driver operate as a switching amplifier with pulse duration modulated pulses, as shown in German Patent Application No. P 27 15 133.

SUMMARY OF THE INVENTION

As stated, the objective of the invention is to further reduce energy consumption relative to known transmitters, and to reduce the expense required to provide known transmitters with carrier control.

In accordance with the invention, this problem is solved by providing a modulation amplifier, having the modulation voltage supplied thereto, constituted by a switching amplifier producing pulse duration modulated pulses, a modulation voltage-controlled pulse duration modulator preceding the switching amplifier, and a filter section following the switching amplifier. A volume dependent control magnitude is indirectly or directly added to the modulation voltage to change the pulse duty factor of the output pulses of the switching amplifier as required for carrier control purposes.

The following considerations are used as a starting point. In the first place, to save power, the average carrier amplitude is decreased at low modulation voltage amplitudes. This already known type of modulation can be combined with an arrangement wherein the modulation amplifier operates, in a known manner, as a pulse duration modulated switching amplifier. It has been surprisingly discovered that this combination can be used for the purpose of very greatly reducing the cost of the switching equipment and of eliminating a power amplifier for a volume dependent control magnitude, such as used in the arrangement shown on page 1306 of the mentioned *Handbook of High Frequency Engineering*, or as shown in FIG. 2 of U.S. Pat. No. 3,413,570.

An object of the invention is to provide an improved amplitude modulated transmitter with a carrier control.

Another object of the invention is to provide such a transmitter, in which the energy consumption, as compared to known transmitters of this type, is even further reduced.

A further object of the invention is to provide such an amplitude modulated transmitter with carrier control in which the cost of components is greatly reduced as compared with known such transmitters with carrier control.

For an understanding of the principles of the invention, reference is made to the following description of a typical embodiment thereof as illustrated in the accompanying drawing.

DESCRIPTION OF THE PREFERRED EMBODIMENTS

Figure 1:
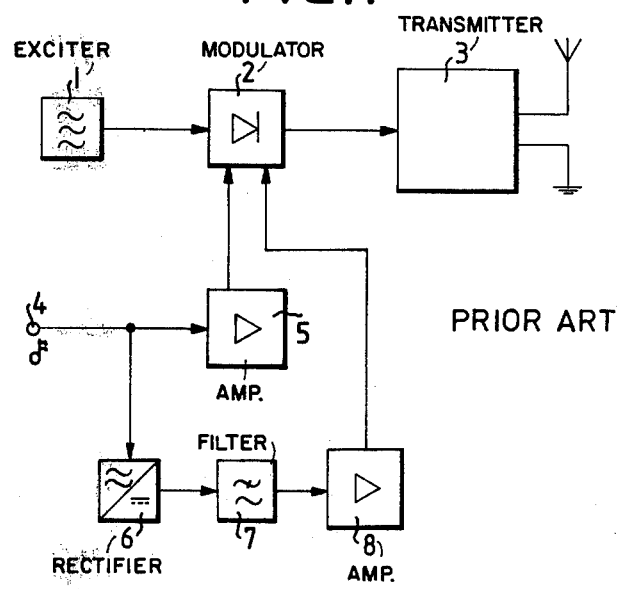
FIG. 1 is a schematic block diagram of a known transmitter with carrier control.

The known transmitter, with carrier control, shown in FIG. 1, is disclosed in F. Vilbig, *Textbook of High Frequency Engineering*, Vol. 2, 5th edition, 1958, Akademische Verlagsgesellschaft mbH, Frankfurt/Main, page 378.

In accordance with the known transmitter shown in FIG. 1, the carrier oscillation, which is supplied from an exciter 1, is modulated in a modulation stage 2 and supplied to a main transmitter 3. The modulation voltage is applied at a terminal 4, is amplified in modulation amplifier 5, and the amplified modulation voltage is fed to modulation stage 2. A part of the modulation voltage at terminal 4 is branched off and rectified in a rectifier 6, with audible alternating currents being filtered out in filter section 7. At the output of filter section 7, there is a slowly variable direct voltage which corresponds to the volume of the modulation voltage. This slowly alternating voltage is amplified in amplifier 8 and also fed to modulating stage 2 as a control magnitude which is a function of the volume of the modulating voltage. The time slope of this control magnitude, in the form of a control voltage, is approximately proportional to the modulation voltage amplitudes. In accordance with this magnitude, the control voltage shifts the operating point on the modulating characteristic of the modulation stage so that a modulation percentage between 0 and 100% is produced at the output of the modulation stage.

By reference to FIG. 1, it will be clear why the expense for carrier control, which is produced by means of components 6, 7 and 8, is not of a minor type or negligible, is that the amplifier 8 must be constructed as a power amplifier, if the modulation storage 2 and the main transmitter 3 are combined for obtaining adequate transmitter efficiency.

Figure 2:
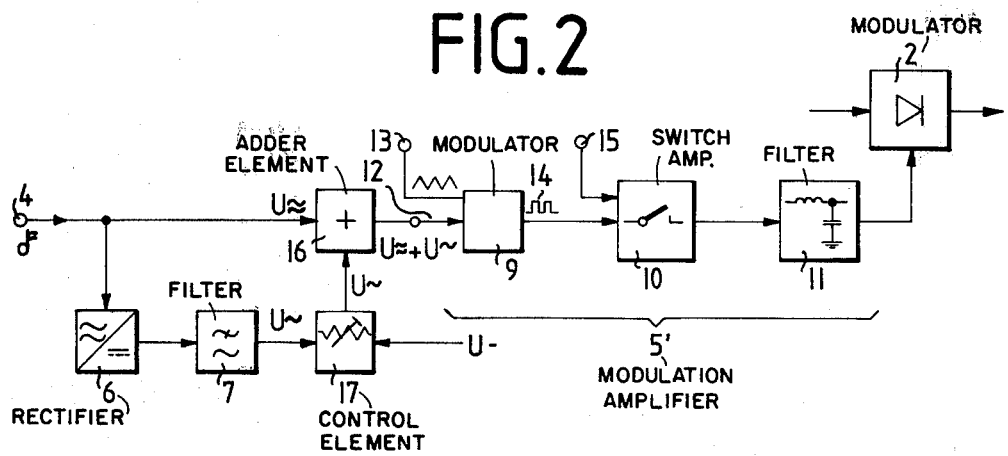
FIG. 2 is a schematic block diagram of one example of a transmitter, with carrier control, in accordance with the present invention.

The embodiment of the invention shown in FIG. 2 corresponds, in some parts, to the known amplitude modulated transmitter, with carrier control, shown in FIG. 1. However, the modulation amplifier 5 of FIG. 1 is replaced, in FIG. 2, by a modulation amplifier 5′ constituted by a pulse duration modulator 9, a switching amplifier 10, and a filter section 11.

Pulse duration modulator 9 operates according to the known saw-tooth wave principle, as disclosed in the mentioned *Handbook of High Frequency Engineering*, 1962, pp. 1325–1326, where the modulating voltage $U \approx + U \sim$ at the terminal 12 is compared with a far higher frequency sawtooth wave voltage at terminal 13 so that, at the output of pulse duration modulator 9, there are always produced, at those times during which the saw-toothwave voltage is either higher or lower than the modulating voltage, positive output pulses.

By means of pulse duration modulated pulses 14, at the output of the pulse duration modulator 9, and whose switching frequency matches the saw-tooth frequency at terminal 13, switching amplifier 10 is controlled to either conduct or not to conduct, so that the high frequency applied at terminal 15 in phase with pulse duration modulated pulses 14 is supplied to the output of switching amplifier 10. Filter section 11 is used for filtering out the direct voltage value and low frequencies. With this arrangement, there is produced, at the output of filter section 11, an amplified modulating voltage $U \approx + U \sim$, and which is supplied to modulating stage 2.

In the same way as in FIG. 1, in the embodiment of the invention shown in FIG. 2, part of the modulating voltage $U \approx$, supplied at terminal 4, is branched off and is rectified in rectifier 6. Filter section 7 filters, out of the output voltage of rectifier 6, a variable direct voltage $U \sim$ forming volume dependent control magnitude which contains also very low frequency components in accordance with the volume of the modulation voltage $U \approx$. However, and by contrast with FIG. 1, this control magnitude is no longer fed to a power amplifier but rather to an adder element 16 connected between terminal 4 and the input of pulse duration modulator 5′. By means of this adder element, the slowly alternating voltage $U \sim$ is superposed on modulation voltage $U \approx$, so that positive pulses 14 are shortened in duration if modulation voltage $U \approx$ has only low amplitudes. In this case, switching amplifier 10 switches the positive high voltage applied at terminal 15 as shorter pulses supplied to filter section 11. Consequently, at the output of filter section 11, there is available an amplified modulation voltage with a lower direct-voltage content.

With high modulating voltage $U \approx$, however, this is amplified by modulation amplifier 5′ by the same factor as with low modulation amplitudes. However, at the output of filter section 11, there is produced a higher direct voltage content around which an amplified modulation voltage oscillates. Nevertheless, this direct-voltage content of the output voltage of filter section 11 determines the operating point on the modulation characteristic of modulation stage 2, in which there is carrier amplitude rising with rising direct voltage content. The carrier value is directly dependent on the direct-voltage content.

By using control means such as a control element 17 of FIG. 2, the volume control magnitude $U \sim$ can be additionally superposed by a fixed set direct-voltage $U_-$. This direct-voltage establishes the average pulse length of pulse 14 and thus the average direct voltage value of the output voltage of filter section 11, and the average operating point on the modulating characteristic of modulation stage 2.

Assuming that, initially, components 6 and 7 of FIG. 2 are not present, then at first modulating voltage $U \approx$ would be superposed only by direct voltage $U_-$, which determines the carrier value at the output of modulating stage 2. With the direct voltage $U_-$, for example, a 1:1 ratio for pulses 14 is set. Upon shifting the pulse duty factor with direct voltage $U_-$, the output voltage of filter section 11 is varied independent of the modulating voltage and also, in this manner, the transmitter carrier power is varied. Replacing the direct voltage $U_-$ completely or partially by the output voltage of filter section 7, as is the purpose of control element 17, not only the pulse duty factor of pulses 14, and thus their direct voltage content, but also the carrier value of the output oscillation of modulating stage 2 are completely or partially varied by the volume of modulation oscillation $U \approx$.

With the carrier ratio (standard modulation rated carrier residual current-to-carrier current ratio) cited in the mentioned Textbook of High Frequency Engineering, Vol. 2, 5th edition, 1958, p. 381, of p=0.6–0.7, the fixed direct voltage value $U_-$ would have to amount to 60–70% of the direct voltage required for a 1:1 pulse duty factor. The missing 30–40% is added by rectification of modulation oscillation $U \approx$. This means that, at 100% modulation, a direct voltage $U_-$ of 60% plus an added $U \sim$ of 40% are automatically set for pulses 14 having a 1:1 pulse duty factor, which matches a 100% modulation rated carrier value. The pulse duty factor is varied around 1:1 by modulation from 0–100% switch-on time. Without modulation, no oscillation $U \sim$ is added, and the pulse duration modulator 9 is set, corresponding to the fixed direct voltage of a 60% carrier value, to a pulse duty factor of about 1:2, namely about 30% switch-on time.

In the embodiment of the invention shown, by way of example, in FIG. 2, modulation stage 2 can be a transmitter output tube for anode modulation, so that the division in modulation stage 2 and main transmitter 3, as shown in FIG. 1, can be omitted. As the modulation amplifier 5′ of FIG. 2, for efficiency improvement, must be designed anyway in the manner as shown, any additional expense is limited, in the example of the invention shown in FIG. 2, to rectifier 6 and filter section 7 and is thus considerably reduced relative to FIG. 1 and is negligibly small by comparison with the resulting energy savings.

While a specific embodiment of the invention has been shown and described in detail to illustrate the application of the principles of the invention, it will be understood that the invention may be embodied otherwise without departing from such principles.

What is claimed is:

1. In an amplitude modulated transmitter having a transmitter modulation stage and adapted for use with a supplied modulation voltage having a transmitter modulation voltage period, and including a carrier control circuit adapted to control a carrier voltage so that the respective amplitudes of the carrier voltage carried within each transmitter modulation voltage period is reduced with decreasing amplitudes of the supplied modulation voltage, the carrier control circuit including a modulation voltage rectifier and filter connected to the supplied modulation voltage for producing a control magnitude for the transmitter modulation stage, which control magnitude is dependent on the volume of the modulation voltage, the improvement comprising, in combination, a modulation amplifier constituted by a switching amplifier for producing pulse duration modulated pulses, a modulation voltage-control pulse duration modulator connected to the input of said switching amplifier and a filter section connected to the output said switching amplifier; said carrier control circuit including deriving means connected to said modulation voltage rectifier and filter for deriving, from the modulation voltage supplied, said volume-dependent control magnitude; and means combining said volume-dependent control magnitude with the modulation voltage supplied to said rectifier and filter, the output of said combining means being coupled to said pulse duration modulator to change the pulse duty factor of the output pulses of said switching amplifier for carrier control of said transmitter.

2. An amplitude modulated transmitter with carrier control, as claimed in claim 1, in which said volume-dependent control magnitude is indirectly added to the modulation voltage.

3. An amplitude modulated transmitter with carrier control, as claimed in claim 1, in which said volume-dependent control magnitude is directly added to the modulation voltage.

4. An amplitude modulated transmitter with carrier control, as claimed in claim 1, wherein said combining means comprise an adder element having the supplied modulation voltage applied to an input thereof; said deriving means supplying said volume-dependent control magnitude to another input of said adder element.

5. An amplitude modulated transmitter with carrier control, as claimed in claim 1, further comprising control means connecting the output of said filter section to said other input of said adder element.

6. An amplitude modulated transmitter with carrier control, as claimed in claim 5, in which the control means comprises a control element having one input connected to the output of said filter; the output of said control element being connected to said other input of said adder element; and means supplying, to another input of said control element, a constant direct voltage.

7. An amplitude modulated transmitter with carrier control, as claimed in claim 6, including means supplying a very high frequency saw-tooth wave voltage to said pulse duration modulator; and means supplying a high frequency voltage to said switching amplifier.

8. An amplitude modulated transmitter for transmitting a carrier oscillation modulated by a modulation voltage comprising, a rectifier for receiving the modulation voltage, a filter connected to said rectifier for filtering the rectified modulation voltage, a control element connected to said rectified filter for receiving said filtered modulation voltage, means connected to said control elements for supplying a constant direct voltage thereto for producing an output formed by the rectified and filtered modulation voltage and the constant direct voltage which forms a volume-dependent control magnitude, an adder element connected to said control element for receiving the output thereof, said adder element also receiving the modulation voltage for producing an output, a modulation voltage-control pulse duration modulator connected to said adder for receiving the output thereof, a switch amplifier connected to said modulation voltage-control pulse duration modulator, a filter connected to said switch amplifier and a modulator connected to said filter and adapted to receive the carrier oscillation.

* * * * *